United States Patent
Lee et al.

(10) Patent No.: US 6,872,590 B2
(45) Date of Patent: Mar. 29, 2005

(54) PACKAGE SUBSTRATE FOR ELECTROLYTIC LEADLESS PLATING AND MANUFACTURING METHOD THEREOF

(75) Inventors: Jong-Jin Lee, Daejeon (KR); Tae-Gui Kim, Cheongju-si (KR)

(73) Assignee: Samsung Electro-Mechanics Co., LTD, Kyunggi-Do (KR)

( * ) Notice: Subject to any disclaimer, the term of this patent is extended or adjusted under 35 U.S.C. 154(b) by 0 days.

(21) Appl. No.: 10/626,437

(22) Filed: Jul. 24, 2003

(65) Prior Publication Data

US 2004/0150080 A1 Aug. 5, 2004

(30) Foreign Application Priority Data

Dec. 30, 2002 (KR) .............................. 10-2002-0087414

(51) Int. Cl.[7] .............................................. H01L 21/44
(52) U.S. Cl. ...................... 438/106; 438/110; 438/121; 438/125; 438/612; 438/678
(58) Field of Search ................................. 438/106, 107, 438/110, 118, 121, 125, 612, 618, 622, 637, 641, 674, 678

(56) References Cited

U.S. PATENT DOCUMENTS

| | | | |
|---|---|---|---|
| 4,606,787 A | | 8/1986 | Pelligrino |
| 6,249,053 B1 | * | 6/2001 | Nakata et al. .............. 438/613 |
| 6,495,394 B1 | * | 12/2002 | Nakata et al. .............. 438/107 |
| 6,565,730 B2 | * | 5/2003 | Chakravorty et al. ........ 205/122 |
| 6,590,291 B2 | * | 7/2003 | Akagawa ..................... 257/774 |
| 6,660,942 B2 | * | 12/2003 | Horiuchi et al. ............. 174/258 |
| 6,767,616 B2 | * | 7/2004 | Ooi et al. .................... 428/209 |
| 6,781,224 B2 | * | 8/2004 | Yoneda et al. .............. 257/686 |
| 6,797,890 B2 | * | 9/2004 | Okubora et al. ............. 361/792 |

* cited by examiner

Primary Examiner—Kevin M. Picardat
(74) Attorney, Agent, or Firm—Gottlieb, Rackman & Reisman, P.C.

(57) ABSTRACT

Disclosed is a package substrate for electrolytic leadless plating, characterized in that a wire bonding pad onto which a semiconductor chip is mounted is subjected to electrolytic leadless Au plating, and a solder ball pad is subjected to OSP metal finishing or electroless Au plating without use of plating lead lines, upon preparation thereof. A method of manufacturing the package substrate is also disclosed. The method includes Cu plating a whole surface of a base substrate having through-holes, developing a first dry film laminated onto the through-holes, removing a copper foil not covered with the first dry film, stripping the first dry film, exposing and developing a second dry film on the substrate so that only an upper portion to be subjected to electrolytic Au plating is exposed, grounding an electrolytic Au plating terminal to a solder ball pad, Ni—Au plating the wire bonding pad, removing the second dry film by a stripping solution, exposing and developing a third dry film, removing the exposed copper foil by an etching solution, removing the third dry film by a stripping solution, performing a series of processes of coating, exposing, developing and drying a solder resist, and subjecting the solder ball pad to OSP metal finishing.

18 Claims, 24 Drawing Sheets

| | With lead lines for use in electrolytic plating | Without lead lines for use in electrolytic plating |
|---|---|---|
| Bond finger |  |  |
| Ball pad |  |  |
| Trace |  |  |

Fig. 10

| Properties | With lead lines for use in electrolytic plating | Ball pad without lead lines -OSP | Ball pad without lead lines-electroless Au plating |
|---|---|---|---|
| Electrical performance | Low | High | High |
| Line density | Low | High | High |
| Reliability | Average | High | High |
| Productivity | High | Average | Average |
| Yield | High | High | High |
| Cost | Average | Average | Low |
| Lead Time | High | Low | Low |

PACKAGE SUBSTRATE FOR ELECTROLYTIC LEADLESS PLATING AND MANUFACTURING METHOD THEREOF

BACKGROUND OF THE INVENTION

1. Field of the Invention

The present invention pertains, in general, to package substrates plated without the use of plating lead lines, and manufacturing methods thereof. More specifically, the present invention pertains to a package substrate for electrolytic leadless plating, in which electrolytic Au plating of the package substrate, such as substrate for ball grid array packages (BGA packages) or chip scale packages (CSP), is characterized in that when a semiconductor chip-mounted wire bonding pad and a solder ball pad are formed on the package substrate, the wire bonding pad is subjected to electrolytic leadless Au plating and the solder ball pad is subjected to OSP (Organic Solderability Preservatives) or electroless Au plating without lead lines for use in plating, and a method of manufacturing such a package substrate.

2. Description of the Prior Art

Despite a streamlining trend in the IC (Integrated Circuits) field, for example, high integration, smaller, lighter and higher performance, the number of lead lines used for IC packages is concurrently increasing. With the intention of mounting large numbers of lead lines on a carrier for a small package, the carrier should comprise PGA (Pin Grid Array). Although the PGA carrier has a large number of lead lines mounted on the small carrier, pins or leads are weak and thus are easily broken. Further, limitations are imposed on high-density integration of the circuits.

In order to solve the drawbacks of the PGA substrate, a BGA package substrate has been typically used in recent years, which is advantageous in terms of easy fabrication of a highly dense substrate due to use of solder balls smaller than the pins. Hence, the BGA substrate is used as a package substrate on which a semiconductor chip is mounted.

As shown in FIG. 1, the conventional BGA package substrate comprises solder balls 8, instead of pins. That is, a copper clad laminate (hereinafter, abbreviated to 'CCL') 4 is formed with inner layer circuits by a general photo-etching process, and a plurality of CCLs 4 are pressed and laminated. Further, through-holes 2 are formed in the CCL 4, of which the inside of each subjected to Cu plating to form a copper plated layer 3, so that the inner layer circuits are electrically conducted. Then, an outer layer circuit 6 having a bond finger 1 to which a semiconductor chip is joined is externally formed on the CCL 4 by a photo-etching process. As such, together with the outer layer circuit 6, a solder ball pad 7 is formed, to which the solder balls 8 are joined and a solder mask 5 is defined.

When a plating process is performed to increase an electrical connection state of the semiconductor chip-joined bond finger 1 and the solder ball-joined pad 7, the lead lines for use in Au plating are used. Each of the Au plating lead lines is connected to the pad 7 to which a respective solder ball 8 is joined, and at the same time, although not shown in the drawing, the lead lines for use in plating are connected to the pad 7 and further to the bond finger 1 through the through-holes 2. In FIG. 2, there is shown a plan view of a package substrate fabricated in the presence of lead lines for use in plating according to conventional techniques, in which each solder ball 8 is joined to the lead line 9. In FIG. 1, a circled portion 'A' denotes a portion formed with the lead lines 9 for use in plating. Substantially, fabrication of high-density circuits is limited attributable to the lead lines.

On the CCL 4 having the outer layer circuit 6 are mounted IC chips, which are connected to the outer layer circuit 6 by means of a conductive wire. A filler is coated on the chips for protection from the external environment. Different from the PGA substrate connected with a main circuit board by means of the pins, the BGA package substrate 10 is electrically conducted with the main circuit board by the solder balls 8 joined to the pad 7 of the CCL 4. Therefore, the BGA is easily miniaturized, compared to the PGA, and thus it is possible to realize high density of the substrate 10.

However, in the conventional package substrate, due to highly dense circuits and miniaturization of a device using such circuits, a pitch (interval between the solder balls) of the solder balls 8 of the BGA package substrate 10 becomes excessively narrow. Simultaneously, circuits around the bond finger 1 onto which the semiconductor chip is mounted become dense. Thus, the lead lines required for Au plating of the bond finger 1 and the pad 7 are difficult to densely form.

Below, a manufacturing process of the package substrate to be Au plated through lead lines for use in plating according to an embodiment of conventional techniques is described, with reference to FIGS. 3a through 3h.

A plurality of through-holes 13 are formed in a CCL 11+12 as a base substrate (FIG. 3a), and a surface of the base substrate and an inner wall of each through-hole are subjected to Cu plating, to form a Cu plated layer 14 (FIG. 3b).

Then, with the aim of patterning the package substrate, a dry film 15 is coated on the CCL, exposed and then developed (FIG. 3c). The CCL 11+12 comprises an insulation layer 11 and copper foils 12 attached onto a top surface and a bottom surface of the insulation layer 11. Substantially, a plurality of through-holes 13 are formed in the CCL 4 by use of a mechanical drill and are subjected to Cu plating to form the copper plated layer 14, on which a series of processes of coating, exposing and developing the dry film 15 are performed for patterning the substrate.

In FIG. 3d, the copper exposed by use of the dry film 15 as an etching resist is removed with the use of an etching solution. As such, lead lines used for performing later Au plating are also formed. In the drawing, reference numeral 16 denotes an exposed copper-etched portion.

Thereafter, the dry film 15 used as the etching resist is removed using a stripping solution (FIG. 3e).

A solder resist (LPSR) 17 is coated, exposed, developed and then dried on a predetermined portion of the substrate (FIG. 3f).

While an electric current is applied to the lead lines for use in plating, a wire bonding pad and a solder ball pad are subjected to Au plating through the lead lines, to form an Au plated layer 18. As such, a plating process is Ni—Au plating, and the plated Au is 0.5–1.0 μm thick (FIG. 3g).

Specifically, with a view to performing metal finishing of the package substrate, onto which the semiconductor chip is mounted, an electrolytic Au plating process is mainly used because the electrolytic plating process is superior to an electroless Au plating in view of reliability. However, since the lead lines necessary for performing the electrolytic Au plating should be inserted into the substrate, line density is decreased. Thus, it is difficult to fabricate a circuit product having high line density.

The lead lines used for plating are cut either by means of a router or by dicing (FIG. 3h). In the drawing, reference numeral 19 indicates a diced portion. That is, when the lead lines, after the electrolytic Au plating is performed, are cut by the router or by dicing, the lead lines may remain on the package substrate. In such a case, noise is generated upon transmission of electrical signals, thus decreasing electrical performance of the package substrate.

Turning now to FIGS. 4a through 4f, there is sequentially illustrated a manufacturing process of a package substrate to be Au plated in the presence of lead lines for use in plating according to another embodiment of conventional techniques.

In the present embodiment, the step of FIG. 4a is carried out after the steps of FIGS. 3a through 3e mentioned above are performed, and thus a description for the steps of FIGS. 3a through 3e is omitted.

The dry film used as the etching resist is removed as in FIG. 3e, after which a solder resist is coated, exposed, developed and then dried on a predetermined portion of the substrate (FIG. 4a).

In FIG. 4b, a dry film 21 is coated onto the solder ball pad of the substrate, and processes of exposure and development are carried out, so that to only a wire bonding pad is subjected to Au plating.

Then, the wire bonding pad is subjected to Au plating through the lead lines to form a 0.5–1.5 $\mu$m thick Au plated layer (FIG. 4c).

The dry film used as a plating resist is removed using a stripping solution (FIG. 4d), and the lead lines used for plating are cut by means of a router or dicing (FIG. 4e). In the drawing, reference numeral 19 indicates a diced portion. That is, after completion of the electrolytic Au plating, the lead lines are cut by the router or by the dicing.

In FIG. 4f, a surface of the solder ball pad is subjected to OSP metal finishing 22.

As such, the lead lines used for plating may remain on the package substrate, and noise is then generated upon transmission of electrical signals, thus lowering electrical performance of the package substrate.

On the other hand, research for electrolytic leadless plating techniques has been carried out by manufacturers of package substrates. In addition, the wire bonding pad or the solder ball pad is subjected to electrolytic Au plating, so that a plated layer having a constant thickness is formed on each pad (plated Au: 0.5–1.5 $\mu$m). However, because Au plated on the solder ball pad is thicker than a desired thickness (0.03–0.25 $\mu$m), a reliability problem for solder ball bonding is caused.

SUMMARY OF THE INVENTION

Therefore, it is an object of the present invention to solve the problems encountered in the prior art and to provide a package substrate for electrolytic leadless plating capable of increasing a line density of the package substrate, and a method of manufacturing the same.

It is another object of the present invention to provide a package substrate for electrolytic leadless plating being able to increase a line density by differently performing metal finishing of a wire bonding pad and a solder ball pad of the package substrate, and a method of manufacturing the same.

It is a further object of the present invention to provide a package substrate capable of inhibiting generation of noise by removing all lead lines used for plating following electrolytic Au plating, and a method of manufacturing the same.

In order to accomplish the above objects, the present invention provides a method of manufacturing a package substrate for electrolytic leadless plating according to a primary embodiment thereof, the method comprising the steps of Cu plating a whole surface of a base substrate having a plurality of through-holes defined in a copper clad laminate, laminating and developing a first dry film on the Cu plated through-holes, and etching a copper foil not covered with the first dry film, thereby patterning an upper portion and a lower portion of the base substrate. Then, the manufacturing method further comprises stripping the first dry film, performing a series of processes of coating, exposing and developing a second dry film on the base substrate so that only the upper portion of the base substrate to be subjected to electrolytic Au plating is exposed, grounding an electrolytic Au plating terminal to a solder ball pad, Ni—Au plating a wire bonding pad through the through-holes, removing the second dry film by use of a stripping solution, and performing a series of processes of coating, exposing and developing a third dry film to pattern the solder ball pad. Thereafter, the method includes etching a copper foil not covered with the third dry film, removing the third dry film by use of a stripping solution, applying a solder resist onto a predetermined portion, which is exposed, developed and then dried, followed by coating an organic solderability preservative on the solder ball pad for metal finishing of the solder ball pad.

The first dry film and the third dry film are used as etching resists, and the second dry film is used as an electrolytic Au plating resist.

Preferably, an Au plated layer following the electrolytic Au plating is 0.5–1.5 $\mu$m thick.

The upper portion of the base substrate to be Au plated is a wire bonding pad.

In addition, the present invention provides a method of manufacturing a package substrate for electrolytic leadless plating according to a second embodiment thereof, the method comprising the steps of Cu plating a whole surface of a base substrate having a plurality of through-holes defined in a copper clad laminate, laminating and developing a first dry film on the Cu plated through-holes, and etching a copper foil not covered with the first dry film for patterning an upper portion and a lower portion of the base substrate. Thereafter, the method includes stripping the first dry film, and performing a series of processes of coating, exposing and developing a second dry film on the base substrate so that only the upper portion of the base substrate to be subjected to electrolytic Au plating is exposed, grounding an electrolytic Au plating terminal to a solder ball pad, Ni—Au plating a wire bonding pad through the through-holes, removing the second dry film by use of a stripping solution, and performing a series of processes of coating, exposing and developing a third dry film to pattern the solder ball pad. Then, the method involves removing a copper foil not covered with the third dry film by use of an etching solution, removing the third dry film by use of a stripping solution, and applying a solder resist onto a predetermined portion, which is exposed, developed and dried. Next, the manufacturing method also includes performing a series of processes of coating, exposing and developing a fourth dry film on the base substrate so that only the solder ball pad to be subjected to electroless Au plating is exposed, subjecting the solder ball pad to electroless Au plating, followed by stripping the fourth dry film.

The first dry film and the third dry film are used as etching resists, and the second dry film is used as an electrolytic Au plating resist. Further, the fourth dry film is used as an electroless Au plating resist.

It is preferred that an Au plated layer following the electrolytic Au plating is 0.5–1.5 $\mu$m thick, and an Au plated layer following the electroless Au plating is 0.03–0.25 $\mu$m thick.

Further, the present invention provides a method of manufacturing a package substrate for electrolytic leadless plating according to a third embodiment thereof, the method comprising the steps of Cu plating a whole surface of a base substrate having a plurality of through-holes defined in a copper clad laminate, laminating and developing a first dry film on the copper plated through-holes, and etching a copper foil not covered with the first dry film. Then, the method further comprises stripping the first dry film by use of a stripping solution, subjecting the surface of the base substrate and the inner wall of each through-hole to electroless Cu plating, performing a series of processes of coating, exposing and developing a second dry film on the base substrate so that only the upper portion of the base substrate to be subjected to electrolytic Au plating is exposed, and removing an electroless copper foil not covered with the second dry film by use of an etching solution. Thereafter, the method also includes subjecting a wire bonding pad to electrolytic Au plating by using the electroless copper foil plated on the base substrate as a plating lead line, removing the second dry film by use of a stripping solution, removing the electroless copper foil plated on the base substrate by use of an etching solution, applying a solder resist onto a predetermined portion, which is exposed, developed and dried, followed by coating an organic solderability preservative on the solder ball pad for metal finishing of the solder ball pad.

The Cu plating step is performed by electroless Cu plating and then electrolytic Cu plating of the surface of the base substrate and the inner walls of the through-holes.

Preferably, a Cu plated layer following the electroless Cu plating is 0.3–0.5 μm thick, and an Au plated layer following the electrolytic Au plating is 0.5–1.5 μm thick.

The etching is performed through flash etching.

The first dry film is used as an etching resist, and the second dry film is used as an electrolytic Au plating resist.

In addition, the present invention provides a package substrate for electrolytic leadless plating, comprising a base substrate having a plurality of through-holes, a first plated layer formed at a predetermined portion on the base substrate and on an inner wall of each through-hole through Cu plating, a circuit pattern formed on an upper portion and a lower portion of the base substrate by etching a part of the first plated layer, a wire bonding pad formed on the etched first plated layer through electrolytic leadless Au plating, a solder resist applied onto portions except for the wire bonding pad, and a solder ball pad formed at a predetermined position of the lower portion of the base substrate.

The solder ball pad is subjected to OSP metal finishing or electroless Au plating to form a thin Au plated layer.

Further, the package substrate further comprises a second plated layer formed at a predetermined portion on the base substrate, the second plated layer functioning as a plating lead line of the wire bonding pad formed through the electrolytic Au plating.

Consequently, the wire bonding pad is subjected to electrolytic leadless Au plating, and the solder ball pad is subjected to OSP or electroless Au plating to form a thinly plated Au. Thereby, the package substrate can be manufactured in the absence of the lead lines for use in plating, and thus circuit line density of the package substrate products is increased and generation of noise can be inhibited due to removal of all the lead lines.

BRIEF DESCRIPTION OF THE DRAWINGS

FIG. 10 is a view comparing the performance of the package substrates according to the present invention.

DETAILED DESCRIPTION OF THE INVENTION

Hereinafter, a detailed description will be given of a package substrate for electrolytic leadless plating and a manufacturing method thereof, in connection with the attached drawings.

1$^{st}$ Embodiment

Referring to FIGS. 6a through 6m, there is sequentially illustrated a manufacturing process of the package substrate for electrolytic leadless plating according to the primary embodiment of the present invention.

Figure 6A:
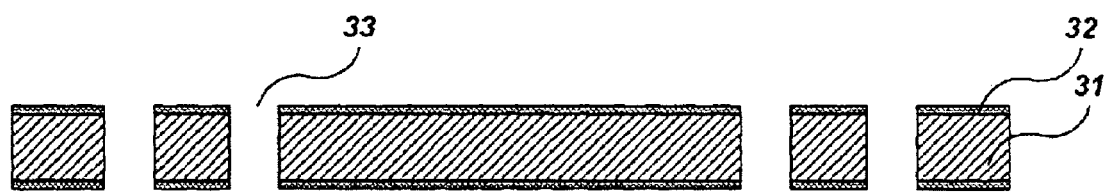
FIGS. 6a through 6m are views sequentially illustrating a manufacturing process of a package substrate for electrolytic leadless plating according to a primary embodiment of the present invention.
Figure 6B:
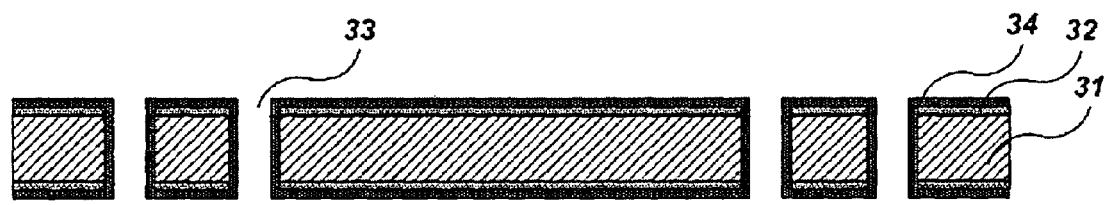

In FIG. 6a, a plurality of through-holes 33 are defined in a base substrate as a copper clad laminate with layers 31 and 32 (hereinbelow, the laminate will be designated by the numeral 31+32), after which a surface of the base substrate and an inner wall of each through-hole are subjected to copper plating, to form a plated layer 34 (FIG. 6b).

Specifically, the package substrate comprises a multilayer sheet laminated by a plurality of copper clad laminates 31+32. As for the copper clad laminate (CCL) 31+32, a copper foil is integrally bonded to both sides of an epoxy sheet by means of a conductive adhesive, in which the reference numeral 31 denotes an insulation layer and the reference numeral 32 denotes the copper foils laminated at a top surface of a bottom surface of the insulation layer 31. The CCL 31+32 has an inner layer circuit consisting of ground patterns or signal treatment patterns, formed by a film etching process. The through-holes 33 are formed to electrically conduct the circuits. With the aim of electrical connection of the circuits, the inner wall of each through-hole 33 is subjected to copper plating, to form a copper plated layer 34.

Figure 6C:
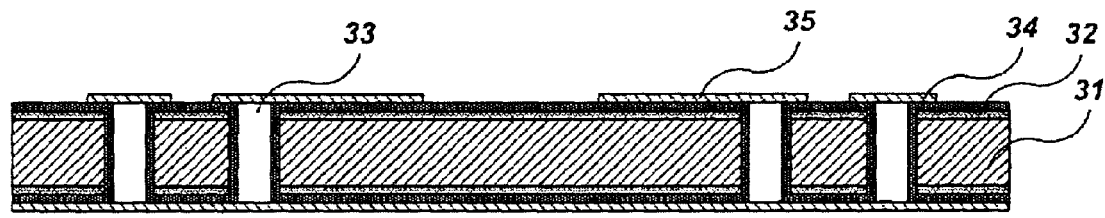

In order to pattern a surface of a wire bonding pad of the package substrate, a dry film 35 is coated on the base substrate, after which processes of exposure and development are performed (FIG. 6c). In the drawing, the reference numeral 36 denotes a copper foil-removed portion.

Figure 6D:
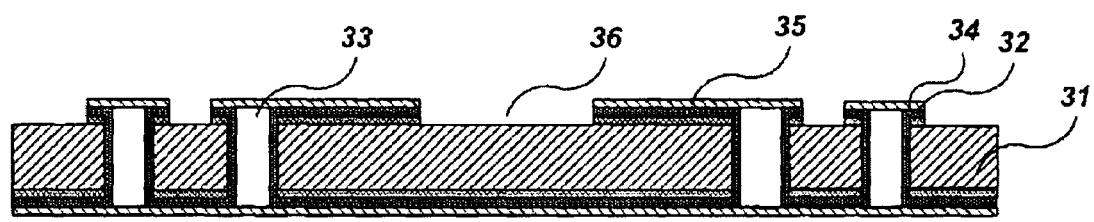
Figure 6E:
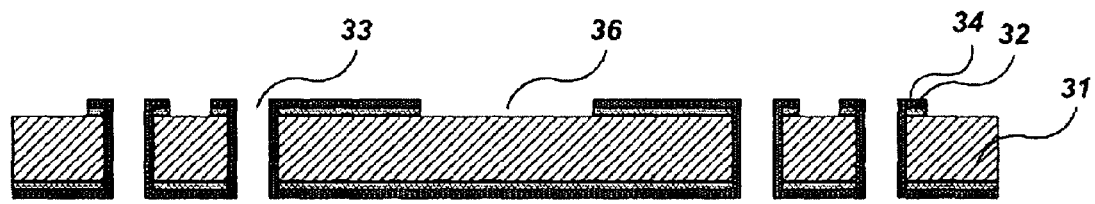

In FIG. 6d, the dry film 35 is used as an etching resist, and the exposed copper is etched by use of an etching solution, thus forming circuit patterns. Thereafter, the dry film used as the etching resist is stripped off by use of a stripping solution (FIG. 6e).

The etching process of the dry film 35 comprises a coating step, a developing step and a stripping step. In the coating step, the dry film used as the etching resist is coated on the copper foil, and irradiated and cured in the state of predetermined regions of the etching resist being blocked. In the developing step, a developing solution is applied to the etching resist to remove non-cured etching resist. In the stripping step, the copper foil of the resist-removed regions is removed by use of a stripping solution.

Figure 6F:
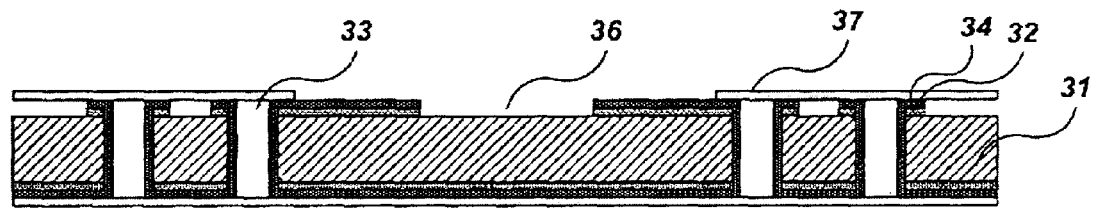

Then, another dry film 37 serving as an electrolytic Au plating resist is coated, exposed and developed on the substrate, so that only a wire bonding pad portion to be subjected to electrolytic Au plating is exposed (FIG. 6f).

Figure 6G:
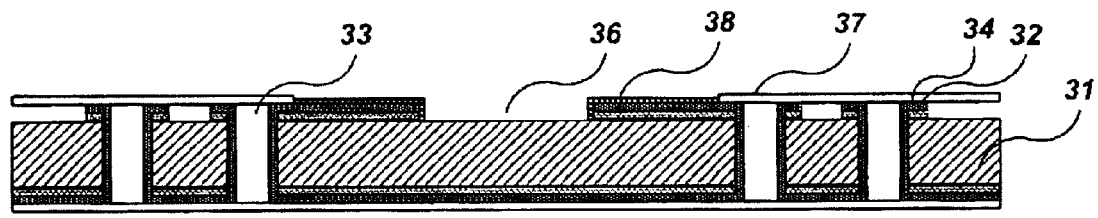

Thereafter, an electrolytic plating terminal is grounded to a surface of a solder ball pad, and an electrolytic Au plated layer 38 on the wire bonding pad through the through-holes is formed at a thickness of 0.5–1.5 $\mu$m (FIG. 6g).

Figure 6H:
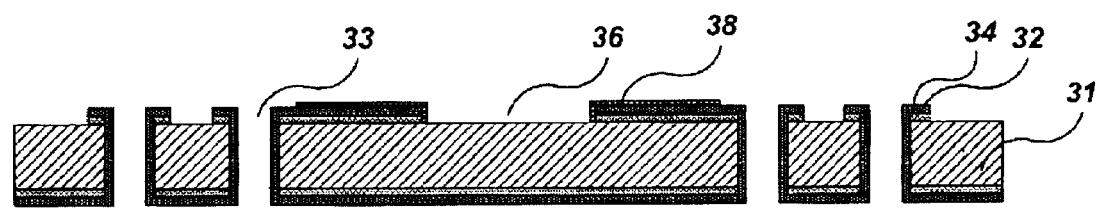
Figure 6I:
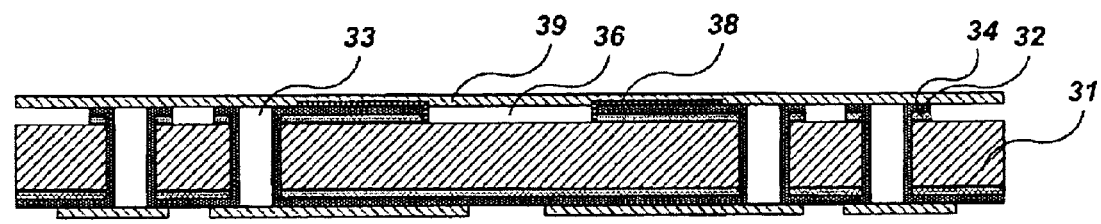

In FIG. 6h, after formation of the electrolytic Au plated layer 38, the dry film 37 used as the plating resist is stripped off by use of a stripping solution. In FIG. 6i, another dry film 39 is coated on the substrate, and processes of exposure and development are performed, so that the surface of the solder ball pad of the package substrate is patterned.

Figure 6J:
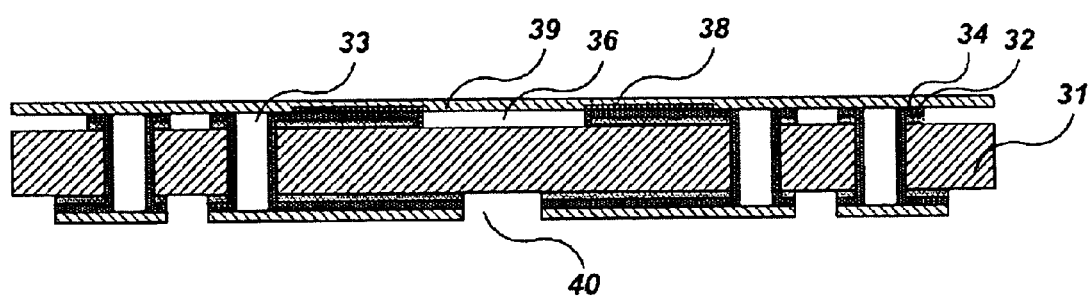
Figure 6K:
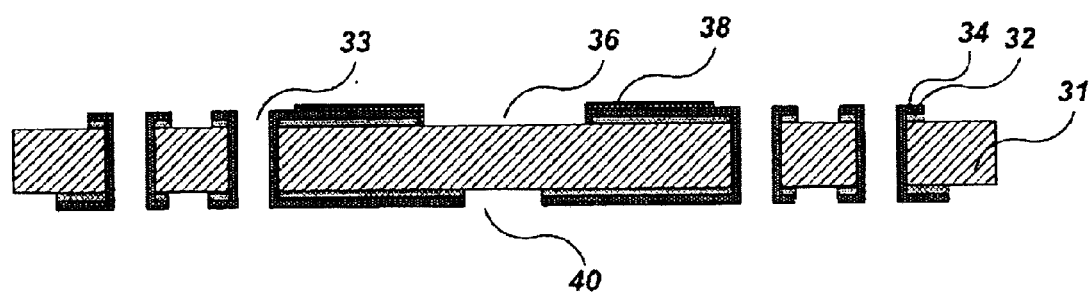

While the dry film 39 is used as an etching resist, the exposed copper is removed by use of an etching solution, thus forming circuit patterns (FIG. 6j). The dry film 39 used as the etching resist is removed by use of a stripping solution (FIG. 6k). In the drawing, the reference numeral 40 denotes the etched portion.

Figure 6L:
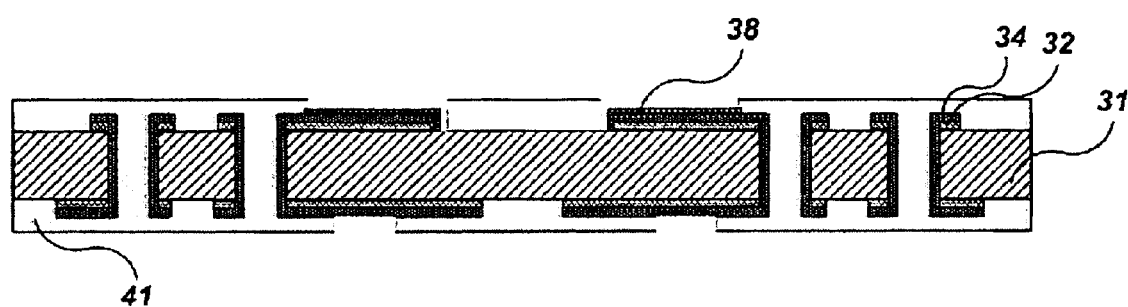
Figure 6M:
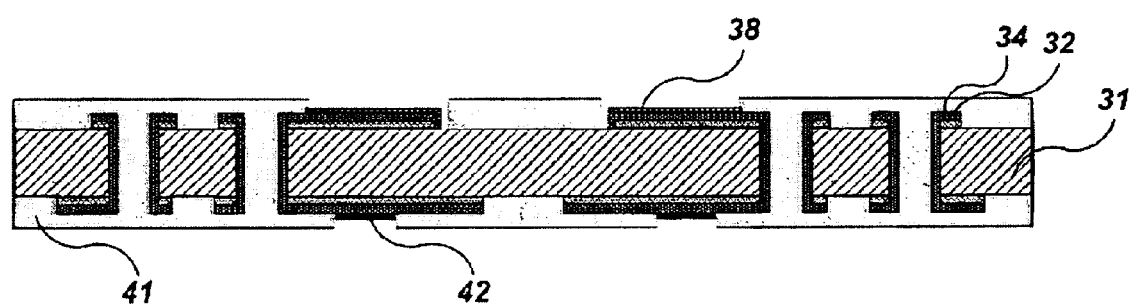

In FIG. 6l, a solder resist 41 is applied, exposed, developed and dried on a predetermined portion of the substrate, and an OSP is coated on the solder ball pad for metal finishing of the solder ball pad 42 (FIG. 6m).

In the first embodiment of the present invention, the wire bonding pad is subjected to electrolytic Au plating, and the solder ball pad is subjected to OSP metal finishing.

2$^{nd}$ Embodiment

Figure 7A:
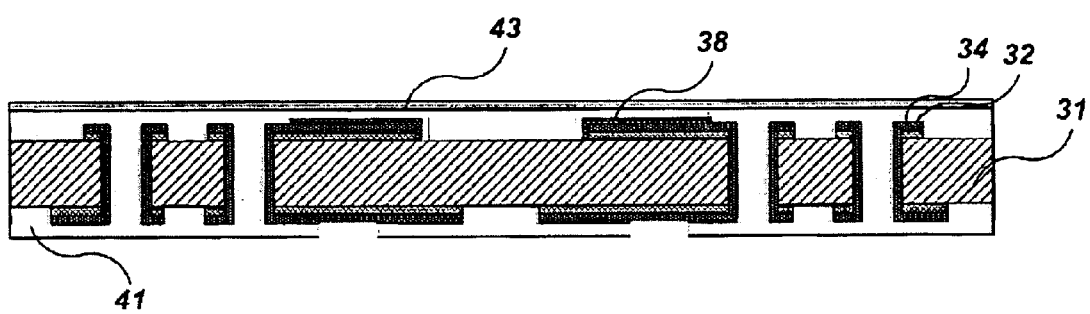
FIGS. 7a through 7c are views sequentially illustrating a manufacturing process of a package substrate for electrolytic leadless plating according to a second embodiment of the present invention.
Figure 7B:
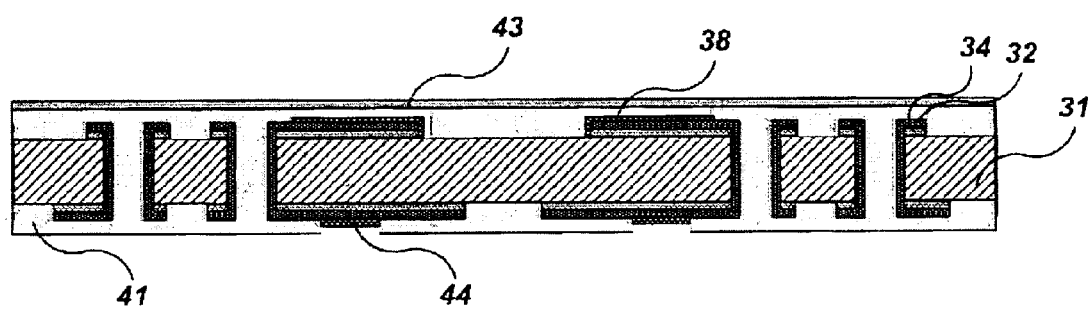
Figure 7C:
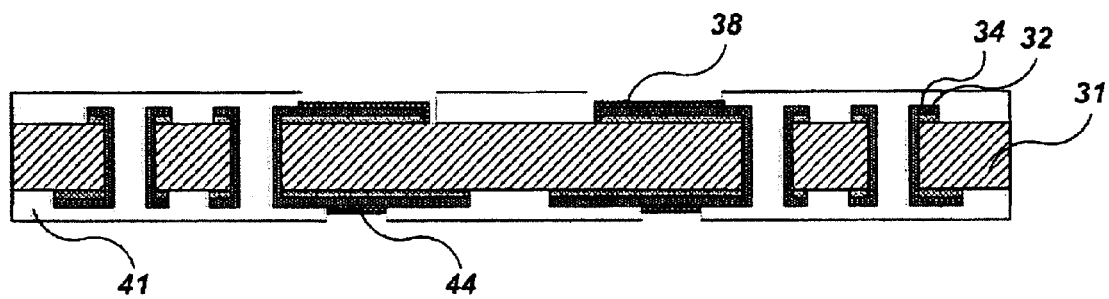

With reference to FIGS. 7a through 7c, there is sequentially illustrated a manufacturing process of the package substrate for electrolytic leadless plating according to the second embodiment of the present invention.

In the present embodiment, the step of FIG. 7a is carried out after the steps of the above mentioned FIGS. 6a through 6l, and thus a description for the steps of FIGS. 6a through 6l is omitted.

After coating, exposing, developing and drying the solder resist 41, as seen in FIG. 6l, a dry film 43 as an electroless Au plating resist is coated, exposed and developed on the substrate, so that only the solder ball pad to be subjected to electroless Au plating is exposed (FIG. 7a).

Then, an electroless Au plated layer 44 is formed at a thickness of 0.03–0.25 $\mu$m on the solder ball pad (FIG. 7b), after which the dry film 43 used as the plating resist is removed using a stripping solution (FIG. 7c).

Comparing the first embodiment with the second embodiment, the solder ball pad formed at a predetermined position of the lower portion of the base substrate, functioning as a plating lead line, is subjected to OSP metal finishing in the first embodiment, and to electroless Au plating treatment to form a thin Au plated layer in the second embodiment. In the second embodiment, a plating process is performed while the lead lines for use in plating are not formed at an outside of the substrate, as in the first embodiment. Thus, the plating lead lines need not be cut.

Figure 1:
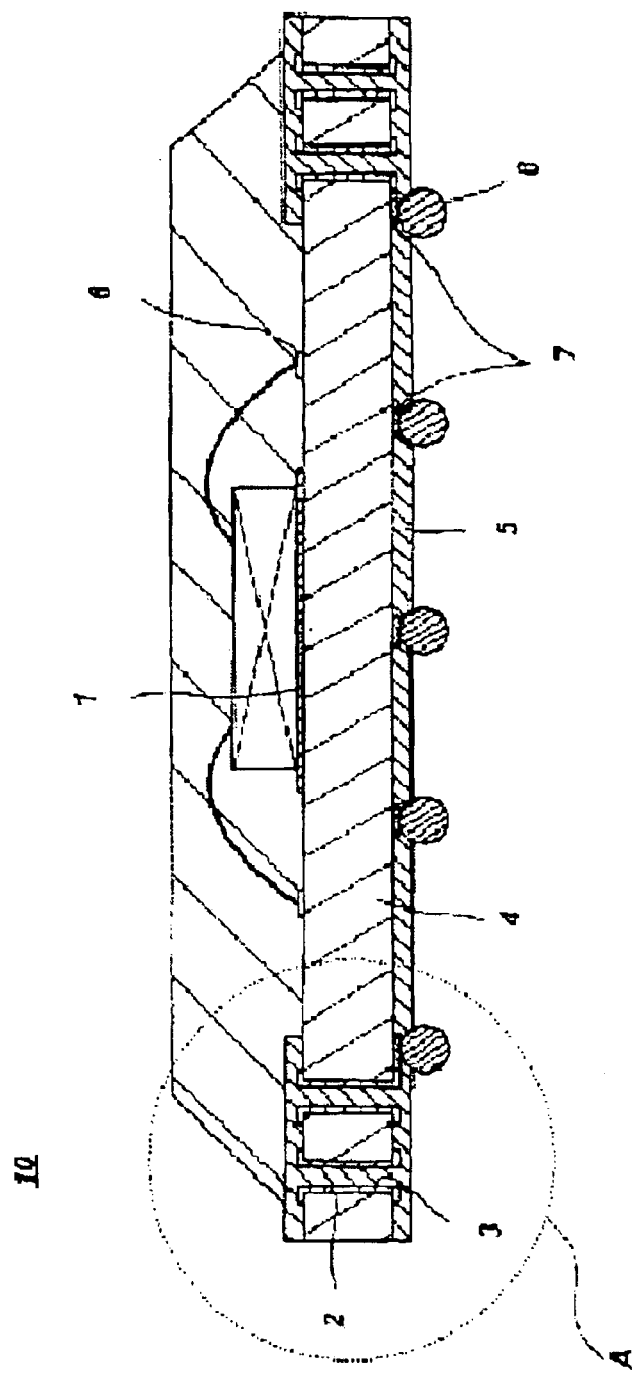
FIG. 1 is a view illustrating a BGA package substrate according to conventional techniques.
Figure 2:
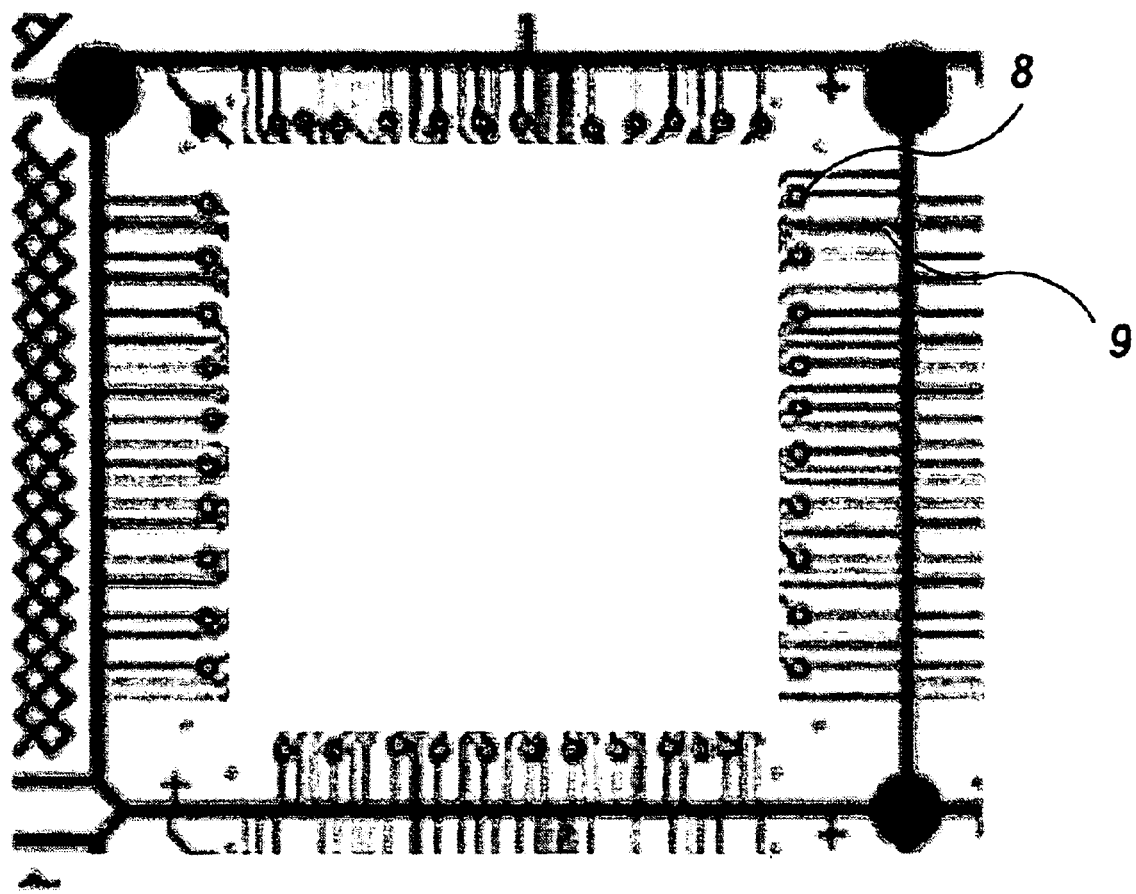
FIG. 2 is a plan view of a package substrate with lead lines for use in plating according to conventional techniques.
Figure 3A:
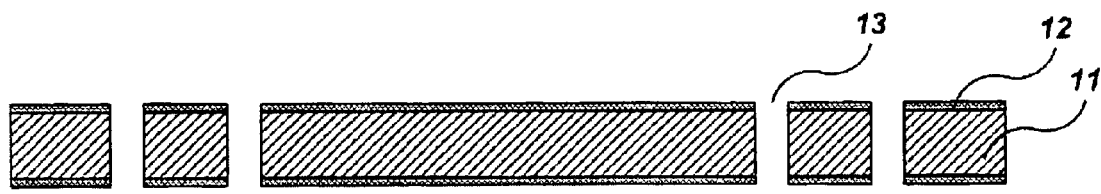
FIGS. 3a through 3h are views sequentially illustrating a manufacturing process of a package substrate by means of lead lines for use in plating according to an embodiment of conventional techniques.
Figure 3B:
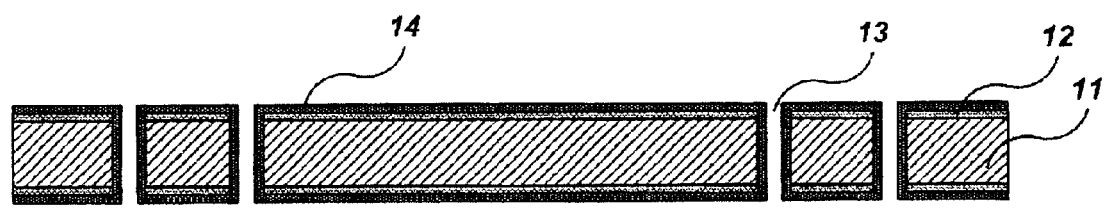
Figure 3C:
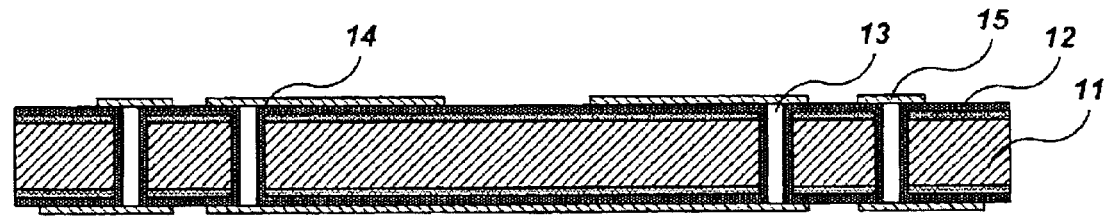
Figure 3D:
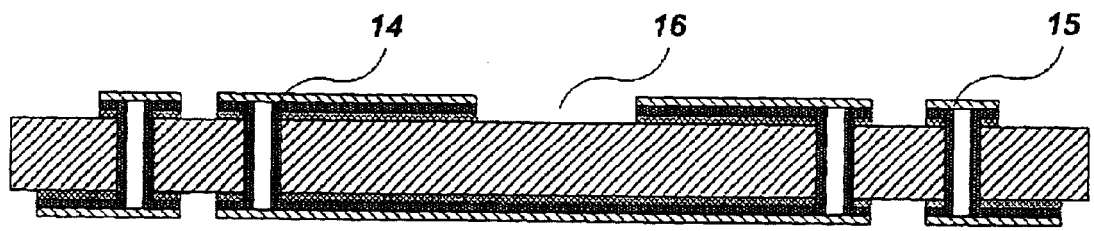
Figure 3E:
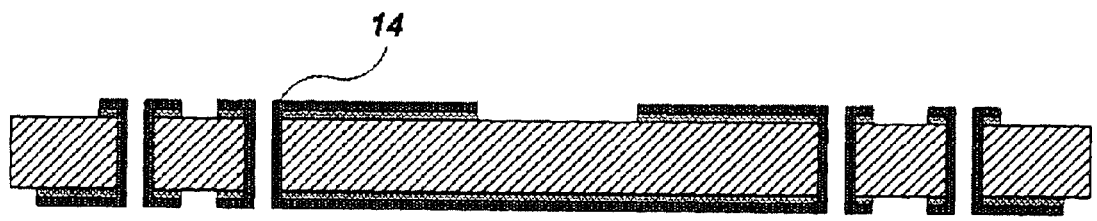
Figure 3F:
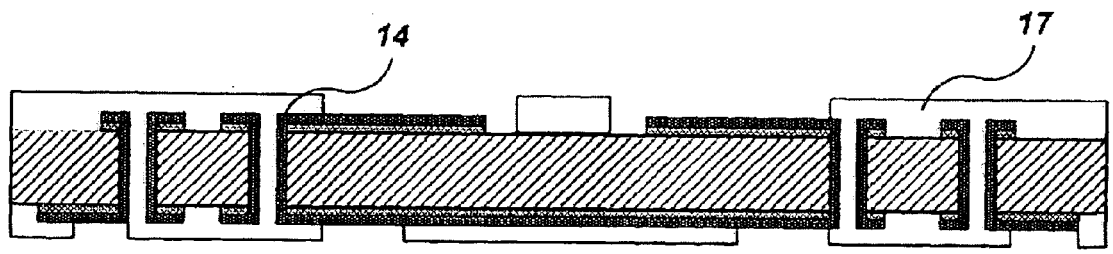
Figure 3G:
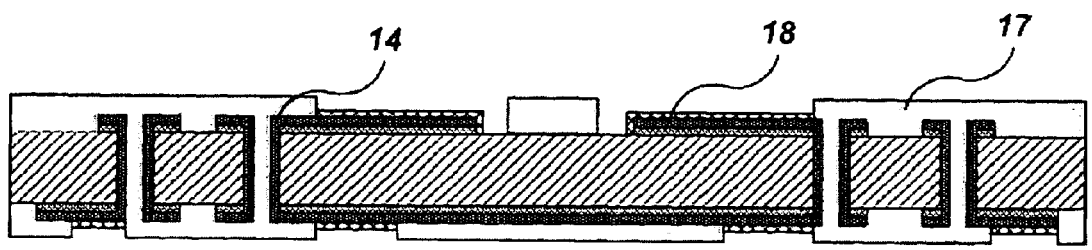
Figure 3H:
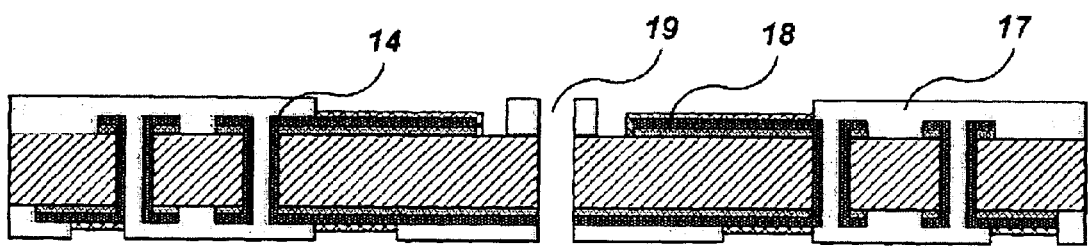
Figure 4A:
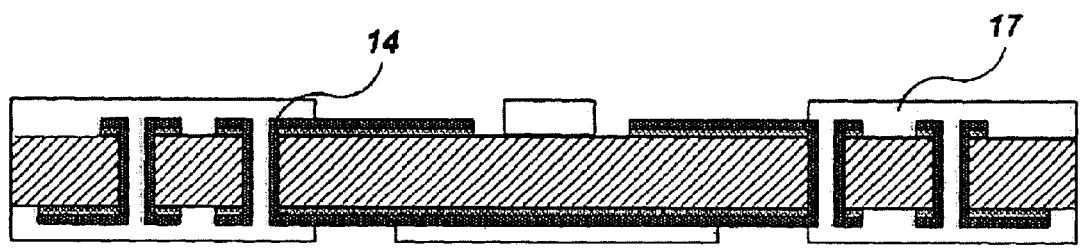
FIGS. 4a through 4f are views sequentially illustrating a manufacturing process of a package substrate by means of lead lines for use in plating according to another embodiment of conventional techniques.
Figure 4B:
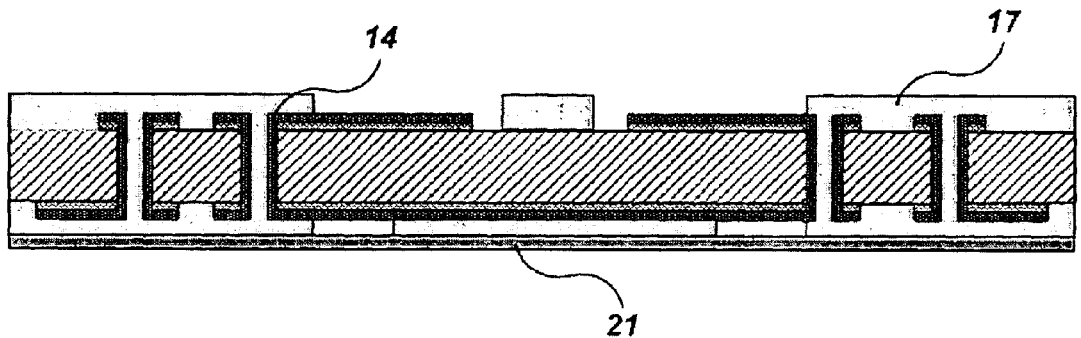
Figure 4C:
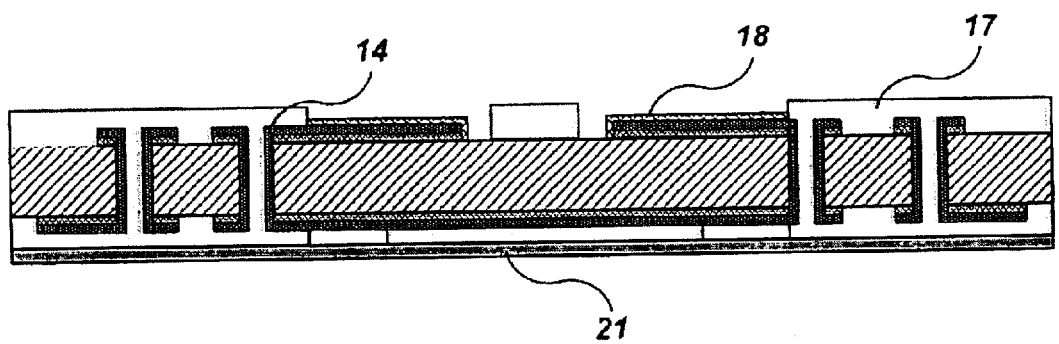
Figure 4D:
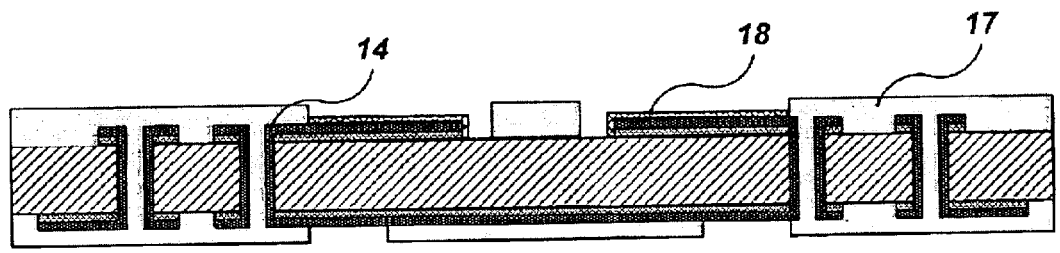
Figure 4E:
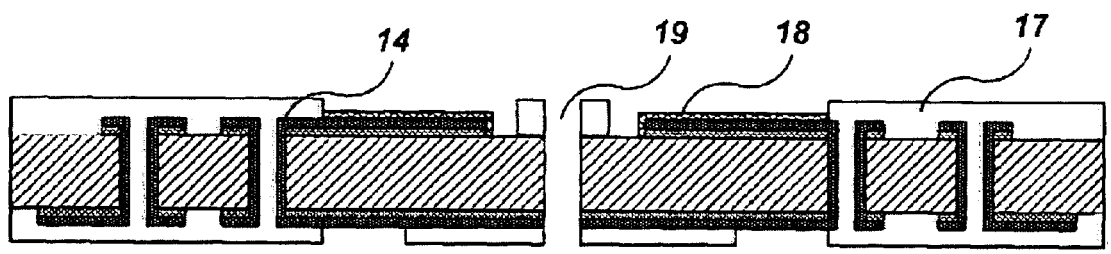
Figure 4F:
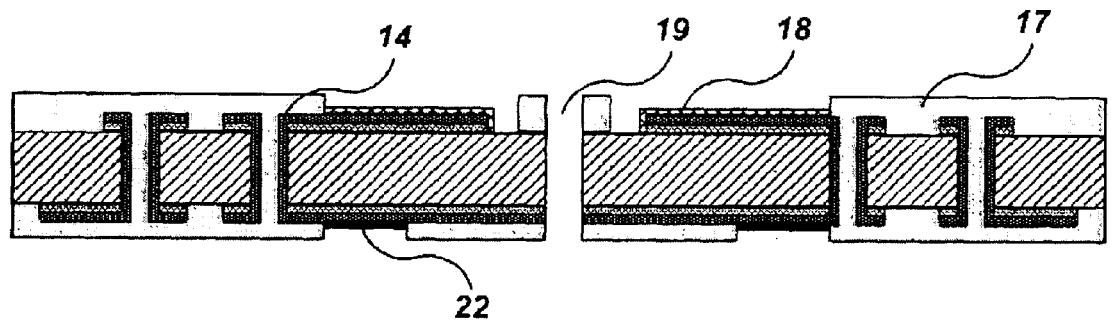
Figure 5:
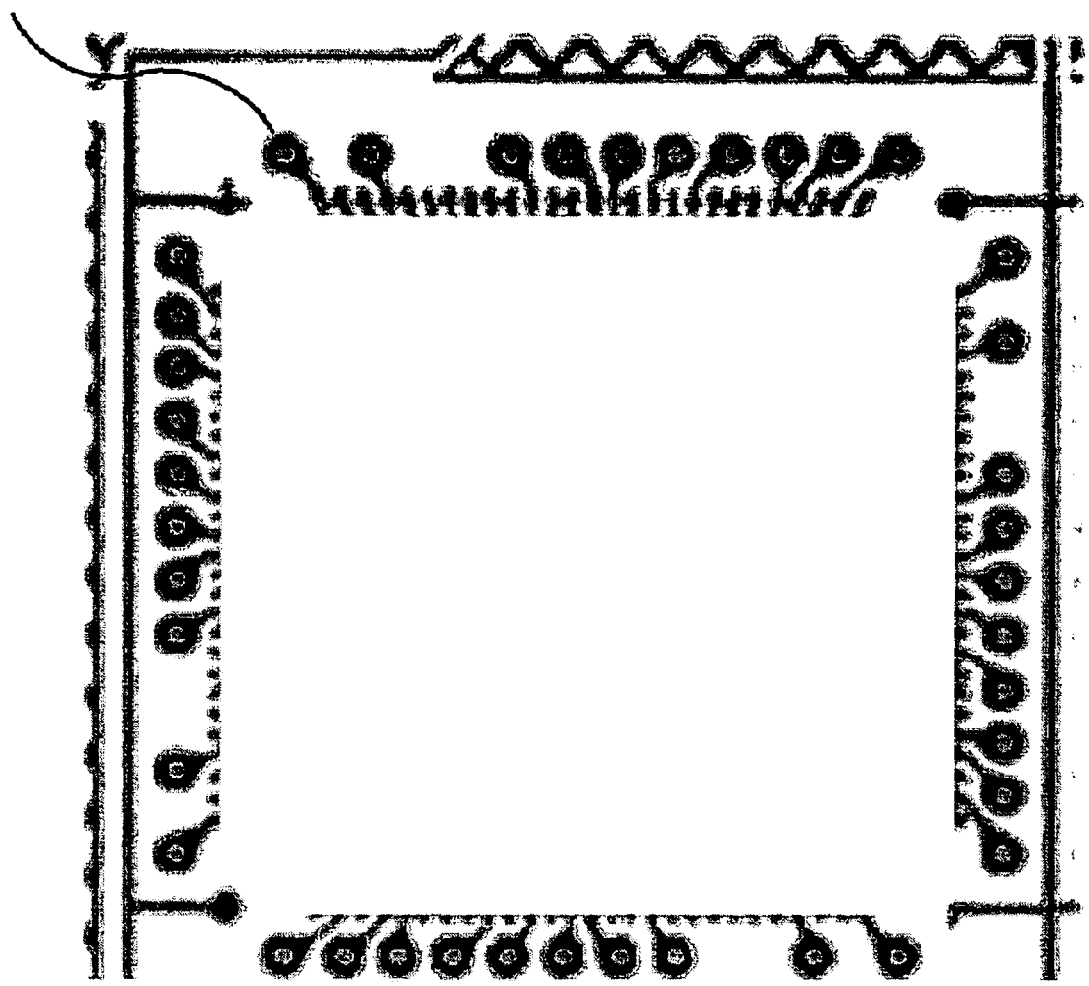
FIG. 5 is a plan view of a package substrate for electrolytic leadless plating according to the present invention.

Meanwhile, FIG. 5 shows a plan view of the package substrate subjected to leadless plating according to the present invention. Different from the conventional package substrate of FIG. 2, the inventive package substrate has no lead lines connected to the solder ball pad 20.

3$^{rd}$ Embodiment

Turning to FIGS. 8a through 8m, there is sequentially illustrated a manufacturing process of the package substrate which is subjected to leadless plating according to the third embodiment of the present invention.

Figure 8A:
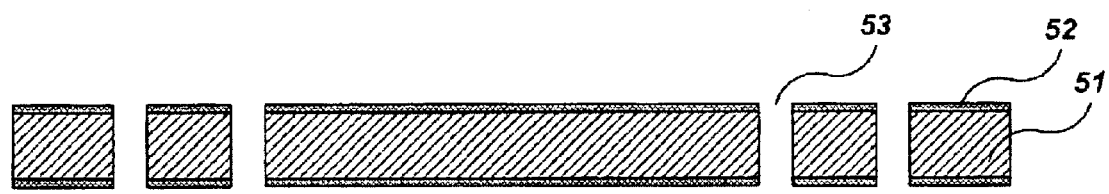
FIGS. 8a through 8m are views sequentially illustrating a manufacturing process of a package substrate for electrolytic leadless plating according to a third embodiment of the present invention.
Figure 8B:
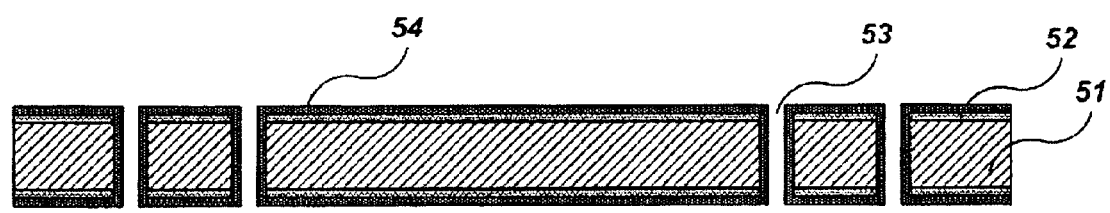

In FIG. 8a, a plurality of through-holes 53 are defined in a base substrate as a copper clad laminate with layers 51 and 52. A surface of the base substrate and an inner wall of each through-hole are subjected to copper plating, to form a copper plated layer 54 (FIG. 8b). The Cu plating process is characterized by performing electroless Cu plating and then electrolytic Cu plating with respect to the base substrate and the inner walls of the through-holes.

Specifically, the package substrate comprises a multilayer sheet laminated with a plurality of copper clad laminates 51+52. The reference numeral 51 denotes an insulation layer and the reference numeral 52 denotes a copper foil laminated on a top surface of a bottom surface of the insulation layer 51. The CCL 51+52 has an inner layer circuit formed by a film etching process, in which the inner layer circuit comprises ground patterns or signal treatment patterns. The through-holes 53 are formed to electrically conduct the circuits. The inner wall of each of the through-holes is subjected to a copper plating process for electrical connection of the circuits, thereby forming a copper plated layer 54. The Cu plating process is characterized by performing electroless Cu plating and then electrolytic Cu plating of the surface of the base substrate and the inner walls of the through-holes.

Figure 8C:
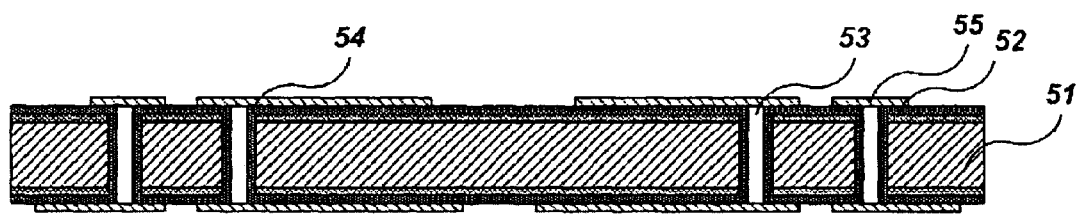

Then, in order to pattern a surface of a wire bonding pad of the package substrate, a dry film 55 is coated on the base substrate, after which processes of exposure and development are performed (FIG. 8c).

Figure 8D:
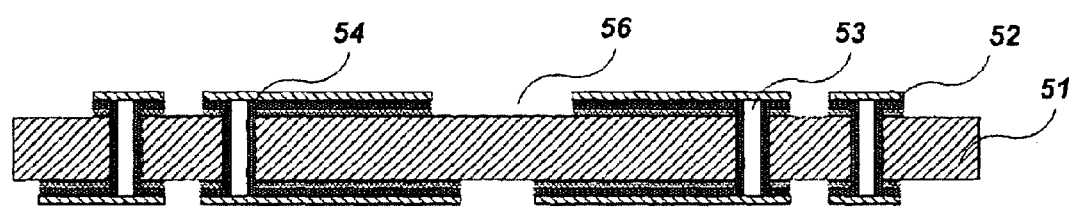
Figure 8E:
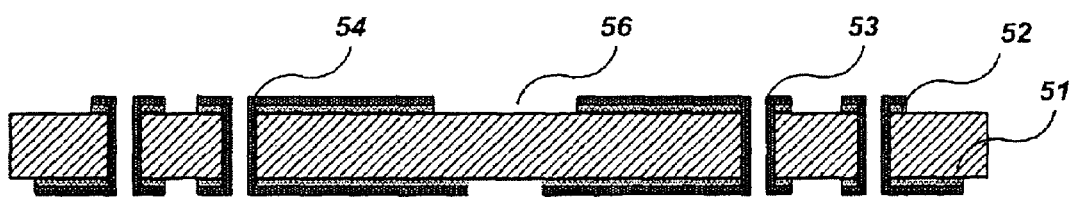

The copper exposed by using the dry film 55 as an etching resist is removed by use of an etching solution, thus forming circuit patterns (FIG. 8d). In the drawing, the reference numeral 56 denotes the copper foil-removed portion. After etching, the dry film 55 used as the etching resist is removed by use of a stripping solution (FIG. 8e).

Figure 8F:
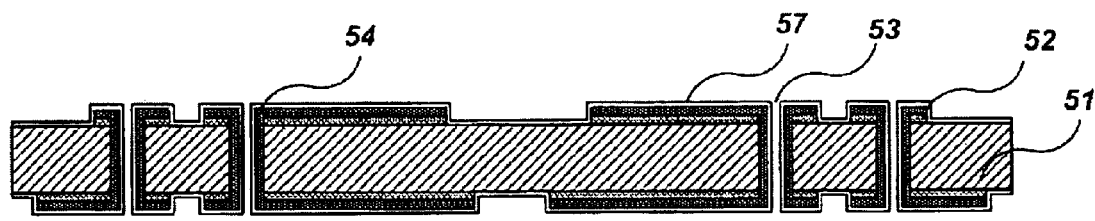
Figure 8G:
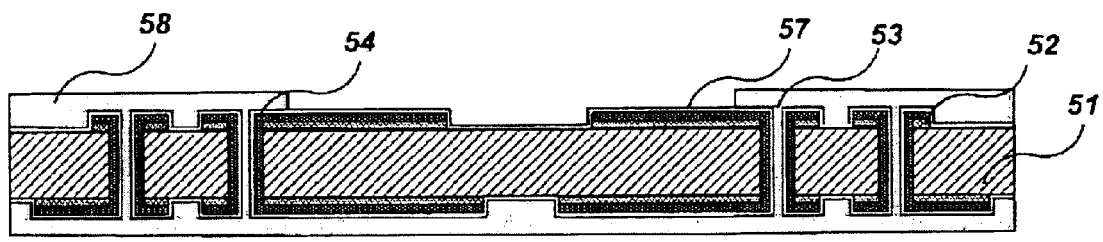

The surface of the base substrate and the inner walls of the through-holes are subjected to electroless Cu plating (FIG. 8f). As such, the plated Cu is 0.3–0.5 $\mu$m thick. A second dry film is coated, exposed and developed on the base substrate, so that only the upper portion of the base substrate to be subjected to electrolytic Au plating is exposed (FIG. 8g).

Figure 8H:
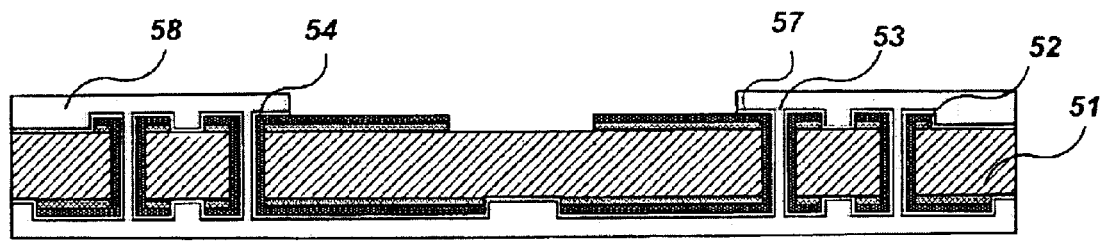

Thereafter, the electroless copper foil which is not covered with the second dry film is removed by flash etching (FIG. 8h).

Figure 8I:
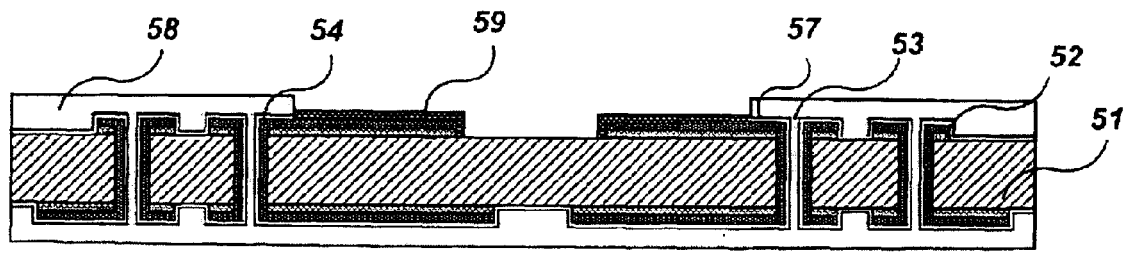
Figure 8J:
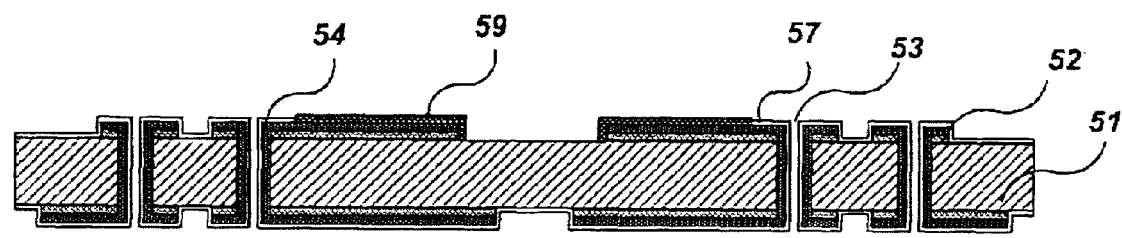

The electroless copper foil plated on the base substrate is used as a lead line for use in plating, and the wire bonding pad is subjected to electrolytic Au plating (FIG. 8i). The electrolytic plated Au is preferably 0.5–1.5 μm thick.

Figure 8K:
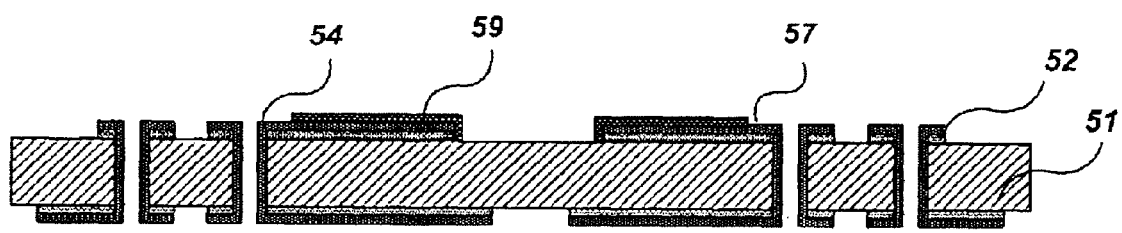
Figure 8L:
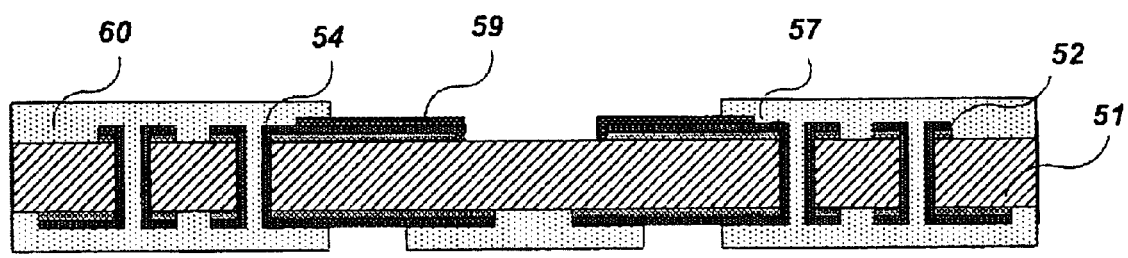

Then, the second dry film is removed using a stripping solution (FIG. 8j), and the electroless copper foil plated on the base substrate is removed by flash etching (FIG. 8k).

Figure 8M:
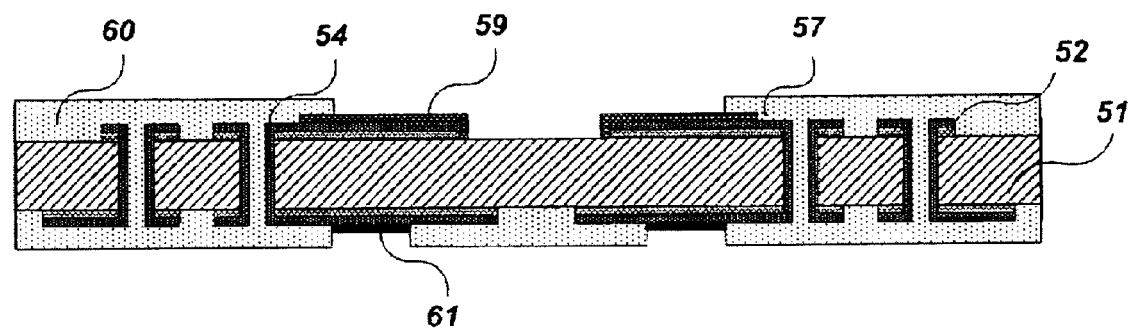

A solder resist is applied, exposed, developed and dried at a predetermined portion of the substrate (FIG. 8l), and the solder ball pad is coated with OSP for metal finishing thereof (FIG. 8m).

In brief, in the first embodiment, the wire bonding pad is subjected to electrolytic Au plating, and the solder ball pad is subjected to OSP metal finishing. In the second embodiment, the wire bonding pad is subjected to electrolytic Au plating, and the solder ball pad is subjected to electroless Au plating which results in the formation of thinly plated Au. In the third embodiment, the electroless copper foil plated on the base substrate is used as the lead line for use in plating, whereby the wire bonding pad is subjected to electrolytic Au plating, and the solder ball pad is subjected to OSP metal finishing. That is, in the first through the third embodiments, the solder ball pad is plated in the absence of the lead lines.

Figure 9:
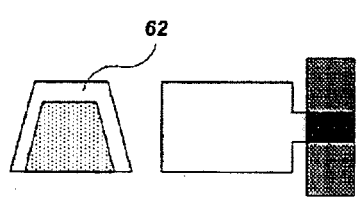
FIG. 9 is a view comparing the package substrates with or without the lead lines used for plating.
Figure 9:
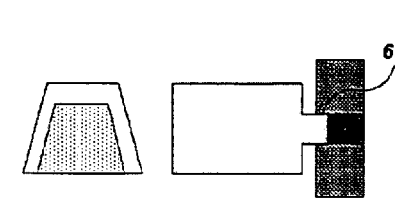
Figure 9:
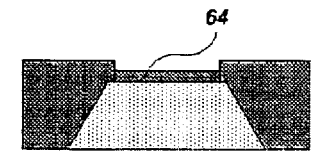
Figure 9:
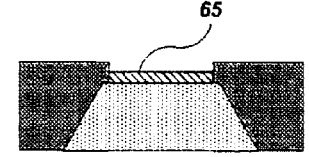
Figure 9:
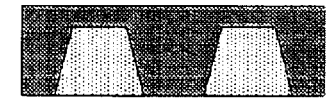
Figure 9:
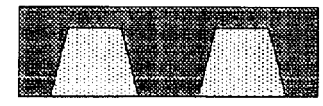

As shown in FIG. 9, a cross-section of the package substrate being subjected to metal finishing in the presence of the lead lines used for plating is compared with that of the package substrate in the absence of the lead lines for use in plating. In the case where the lead lines are absent, a bond finger is designated to reference numeral 63. The reference numeral 62 denotes the Ni/Au plated layer, reference numeral 64 denotes a conventional Au plated layer, and reference numeral 65 denotes a plated layer on a solder ball pad being subjected to OSP metal finishing according to the present invention.

FIG. 10 shows performance of the package substrate according to the present invention. As shown in FIG. 10, the package substrate having OSP ball pads without the lead lines for use in plating or having electroless Au plated ball pads without the lead lines is excellent in electrical performance and line density, and is good in reliability, compared to conventional substrates with the lead lines used for plating still attached.

Figure 11A:
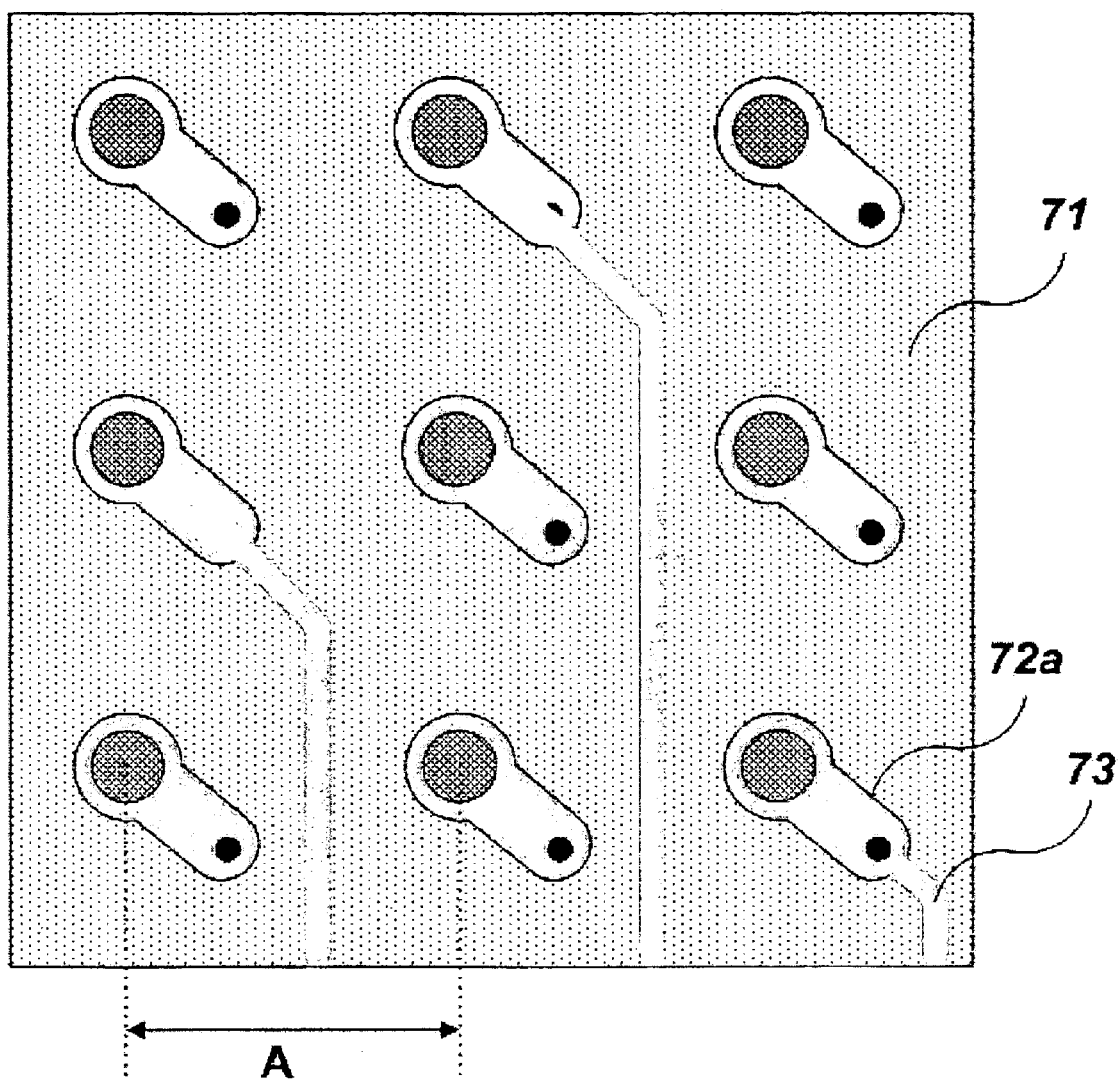
FIGS. 11a and 11b are views illustrating line density according to conventional techniques and the present invention, respectively.
Figure 11B:
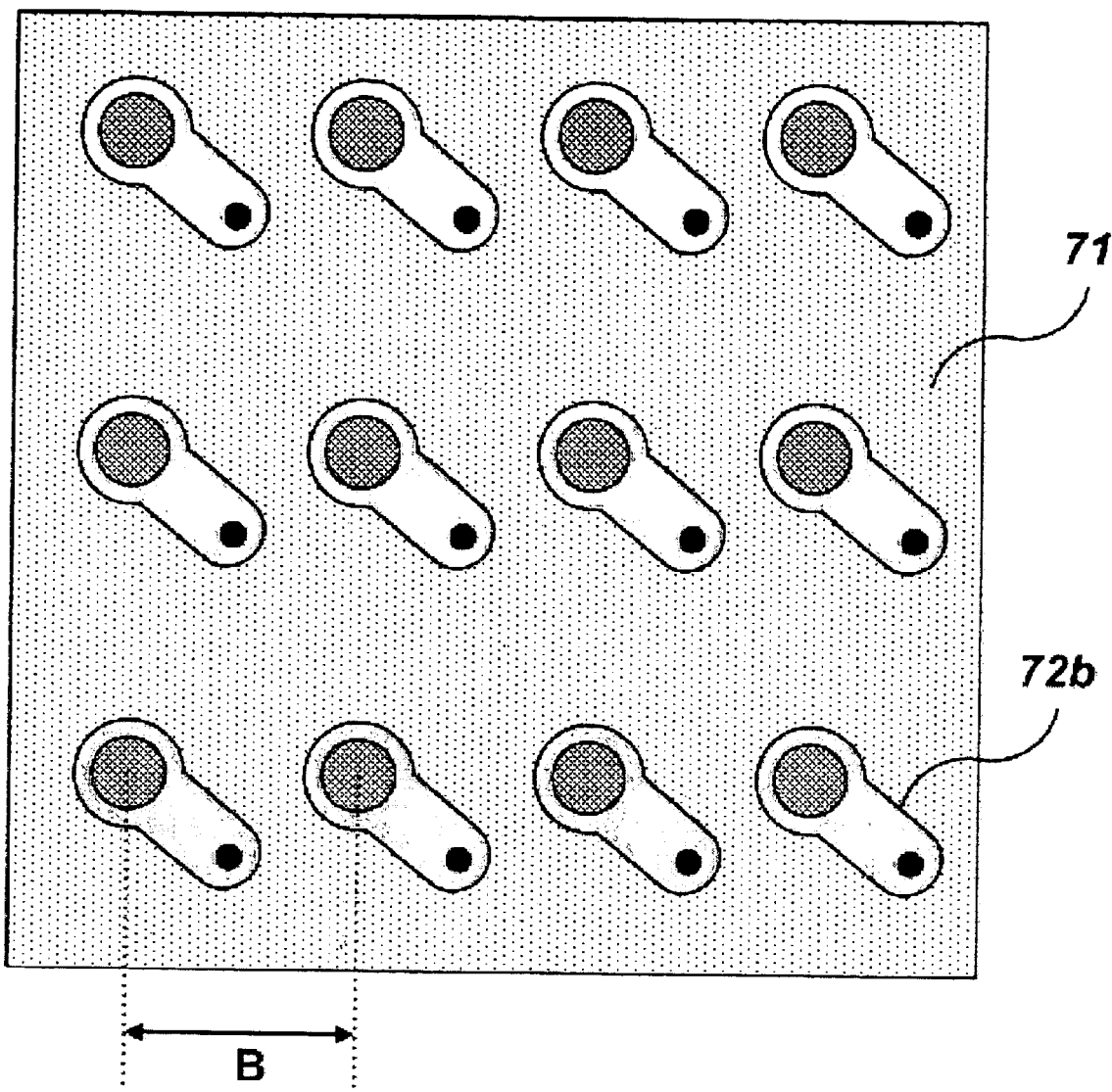

FIGS. 11a and 11b illustrate circuit density according to conventional techniques and the present invention, respectively. As shown in FIG. 11a, in solder ball pads 72a formed on a package substrate 71, a ball pad pitch between centers of two neighboring solder ball pads is indicated as A. As such, the reference numeral 73 denotes a lead line used for plating. As shown in FIG. 11b, in solder ball pads 72b formed on a package substrate 71 of the present invention, a ball pad pitch between centers of two neighboring solder ball pads is indicated as B, which is decreased by about 0.1–0.15 mm compared to the ball pad pitch A. That is, in FIG. 11b, since the lead line 73 shown in FIG. 11a is not used, more solder ball pads are formed on the package substrate 72 having the same area as the substrate 71, thus increasing circuit density.

Upon electrolytic Au plating of the package substrate such as BGA substrate and CSP substrate, leadless Au plating is performed, whereby generation of signal noise can be prevented. Thus electrical performance of the package substrate is increased. Further, since the lead lines for use in plating are unnecessary in the present invention, a patterning design is freely performed. Further, the ball pad pitch is decreased by about 0.1–0.15 mm, compared to conventional ball pad pitches, thus enabling the manufacturing of high-density circuits.

As described above, according to the present invention, generation of signal noise is prevented due to the absence of the lead lines for use in electrolytic Au plating, thereby increasing electrical performance of the package substrate.

In addition, according to the present invention, a patterning design is freely performed because of the lack of unnecessary lead lines, and high-density circuits are easily manufactured.

Further, according to the present invention, metal finishing of the solder ball pads is differently performed from that of the wire bonding pads, thereby increasing bonding reliability between the solder ball pads and the solder balls.

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

What is claimed is:

1. A method of manufacturing a package substrate for electrolytic leadless plating, comprising the following steps of:

(a) copper plating a whole surface of a base substrate having a plurality of through-holes defined in a copper clad laminate;

(b) laminating a first dry film on the copper plated through-holes, followed by developing the laminated dry film;

(c) etching a copper foil not covered with the first dry film so that an upper portion and a lower portion of the base substrate are patterned;

(d) stripping the first dry film, followed by coating, exposing and developing a second dry film on the base substrate so that only the upper portion of the base substrate to be subjected to electrolytic Au plating is exposed;

(e) grounding an electrolytic Au plating terminal to a solder ball pad, followed by Ni—Au plating a wire bonding pad through the through-holes;

(f) removing the second dry film by use of a stripping solution;

(g) coating, exposing and developing a third dry film on the substrate to pattern the solder ball pad;

(h) removing a copper foil not covered with the third dry film by use of an etching solution, to form circuit patterns;

(i) removing the third dry film by use of a stripping solution;

(j) applying a solder resist onto a predetermined portion of the substrate, which is exposed, developed and then dried; and (k) coating an organic solderability preservative on the solder ball pad for metal finishing of the solder ball pad.

2. The method as defined in claim 1, wherein the first dry film and the third dry film are used as etching resists.

3. The method as defined in claim 1, wherein the second dry film is used as an electrolytic Au plating resist.

4. The method as defined in claim 1, wherein an Au plated layer following the electrolytic Au plating is 0.5–1.5 μm thick.

5. The method as defined in claim 1, wherein the upper portion to be subjected to the Au plating is a wire bonding pad.

6. A method of manufacturing a package substrate for electrolytic leadless plating, comprising the following steps of:
   (a) copper plating a whole surface of a base substrate having a plurality of through-holes defined in a copper clad laminate;
   (b) laminating a first dry film on the copper plated through-holes, followed by developing the laminated dry film;
   (c) etching a copper foil not covered with the first dry film so that an upper portion and a lower portion of the base substrate are patterned;
   (d) stripping the first dry film, followed by coating, exposing and developing a second dry film on the base substrate so that only the upper portion of the base substrate to be subjected to electrolytic Au plating is exposed;
   (e) grounding an electrolytic Au plating terminal to a solder ball pad, followed by Ni—Au plating a wire bonding pad through the through-holes;
   (f) removing the second dry film by use of a stripping solution;
   (g) coating, exposing and developing a third dry film on the substrate to pattern the solder ball pad;
   (h) removing a copper foil not covered with the third dry film by use of an etching solution, to form circuit patterns;
   (i) removing the third dry film by use of a stripping solution;
   (j) applying a solder resist onto a predetermined portion of the substrate, which is exposed, developed and then dried;
   (k) coating, exposing and developing a fourth dry film on the base substrate so that only the solder ball pad to be subjected to electroless Au plating is exposed;
   (l) subjecting the solder ball pad to electroless Au plating; and
   (m) removing the fourth dry film by use of a stripping solution.

7. The method as defined in claim 6, wherein the first dry film and the third dry film are used as etching resists.

8. The method as defined in claim 6, wherein the second dry film is used as an electrolytic Au plating resist.

9. The method as defined in claim 6, wherein the fourth dry film is used as an electroless Au plating resist.

10. The method as defined in claim 6, wherein an Au plated layer following the electrolytic Au plating is 0.5–1.5 $\mu$m thick.

11. The method as defined in claim 6, wherein an Au plated layer following the electroless Au plating is 0.03–0.25 $\mu$m thick.

12. A method of manufacturing a package substrate for electrolytic leadless plating, comprising the following steps of:
   (a) copper plating a whole surface of a base substrate having a plurality of through-holes defined in a copper clad laminate;
   (b) laminating a first dry film on the copper plated through-holes, followed by developing the laminated dry film;
   (c) removing a copper foil not covered with the first dry film by use of an etching solution, to form circuit patterns;
   (d) stripping the first dry film by use of a stripping solution;
   (e) subjecting the surface of the base substrate and the inner wall of each through-hole to electroless Cu plating;
   (f) coating, exposing and developing a second dry film on the base substrate so that only an upper portion of the base substrate to be subjected to electrolytic Au plating is exposed;
   (g) removing an electroless copper foil not covered with the second dry film by use of an etching solution;
   (h) subjecting a wire bonding pad to electrolytic Au plating by using the electroless copper foil plated on the base substrate as a plating lead line;
   (i) removing the second dry film by use of a stripping solution;
   (j) removing the electroless copper foil plated on the base substrate by use of an etching solution;
   (k) applying a solder resist onto a predetermined portion of the substrate, which is exposed, developed and then dried; and
   (l) coating an organic solderability preservative on the solder ball pad for metal finishing of the solder ball pad.

13. The method as defined in claim 12, wherein the above copper plating step (a) is performed by electroless copper plating and then electrolytic copper plating of the surface of the base substrate and the inner walls of the through-holes.

14. The method as defined in claim 12, wherein a Cu plated layer following the electroless Cu plating of the above step (e) is 0.3–0.5 $\mu$m thick.

15. The method as defined in claim 12, wherein an Au plated layer following the electrolytic Au plating is 0.5–1.5 $\mu$m thick.

16. The method as defined in claim 12, wherein the etching is performed through flash etching.

17. The method as defined in claim 12, wherein the first dry film is used as an etching resist.

18. The method as defined in claim 12, wherein the second dry film is used as an electrolytic Au plating resist.

* * * * *